United States Patent

Onoda

[11] Patent Number: 5,949,079
[45] Date of Patent: Sep. 7, 1999

[54] METHOD OF AND AN APPARATUS FOR ELECTRON BEAM EXPOSURE

[75] Inventor: Naka Onoda, Tokyo, Japan

[73] Assignee: NEC Corporation, Tokyo, Japan

[21] Appl. No.: 09/253,075

[22] Filed: Feb. 19, 1999

Related U.S. Application Data

[62] Division of application No. 08/953,589, Oct. 17, 1997.

[30] Foreign Application Priority Data

Oct. 17, 1996 [JP] Japan .................................. 8-274770

[51] Int. Cl.⁶ .................................................. H01J 37/302
[52] U.S. Cl. ................................................... 250/492.22
[58] Field of Search ............................ 250/492.22, 492.2, 250/491.1, 398

[56] References Cited

U.S. PATENT DOCUMENTS 5,051,598  9/1991  Ashton et al. ........................ 250/492.2

FOREIGN PATENT DOCUMENTS 57-186331  11/1982  Japan .
62-57216   3/1987   Japan .
3-219617   9/1991   Japan .
9-15139    2/1996   Japan .

*Primary Examiner*—Kiet T. Nguyen
*Attorney, Agent, or Firm*—Scully, Scott Murphy and Presser

[57] ABSTRACT

A method and an apparatus for electron beam exposure convenient to be applied to the hybrid exposure of a pattern with ultra-fine design rules, a method of electron beam exposure comprises: a primary field dividing step (S2) for dividing a second pattern to be drawn into a plurality of fields having a size whereon an electron beam can be radiated with negligible biasing distortion; a primary fitting step for performing a fitting process (S3) for each of the plurality of fields, wherein cubic compensation equations are adjusted to fit compensation values with the optical distortion, and a fitting error after compensation being calculated; a primary field dividing step for performing a field dividing process (S5) for each of the plurality of fields whereof the fitting error is larger than a predetermined allowable range, wherein a concerning field is divided into a pair of sub fields and the fitting process is performed for each of the sub fields; and a sub field dividing step for repeating the field dividing process for each of the sub fields, the fitting error thereof larger than the predetermined allowable range and a size thereof larger than a predetermine minimum size.

1 Claim, 4 Drawing Sheets

5,949,079

METHOD OF AND AN APPARATUS FOR ELECTRON BEAM EXPOSURE

This application is a divisional of patent application Ser. No. 08/953,589 filed Oct. 17, 1997.

BACKGROUND OF THE INVENTION

The present invention relates to electron beam exposure, and more particularly to that for drawing such a pattern as an IC (Integrated Circuit) directly on a semiconductor wafer.

Micro-miniaturization and high density integration of semiconductor IC chips have been remarkably progressed in recent years, and ultra-fine design rules are applied now.

Formerly, optical exposure is used for pattern printing in most mass-production lines of IC chips. However, a spotlight is now on the electron beam exposure, which has high resolution and needs no reticle, for processing tile ultra-fine pattern difficult to be printed with the optical exposure. In order to make use of the high productivity of the optical exposure as well as the high resolution of the electron beam exposure, a hybrid technology is pursued to apply the optical exposure to patterns having larger design rules and the electron beam exposure to those having ultra-fine design rules.

FIG. 4 is a schematic diagram illustrating configuration of a conventional example of the electron beam exposure system.

The apparatus of FIG. 4 has a main body 1 comprising an electron gun 11 for generating an electron beam 10 which is accelerated with an electric field impressed by an acceleration supply 16, an electron barrel 12 including various electrodes such as electromagnetic lenses and apertures taking charge of control of the electron beam 10, that is, converging, blanking, positioning or intensity control thereof, for example, and a material chamber 13 including a wafer table whereon a wafer 20 is placed for drawing, and an X-Y stage 15 for controlling position of the wafer table. The main body 1 are sucked into vacuum by vacuum pumps 4A to 4C and installed on an anti-vibration table 5.

A computer 3B is provided for controlling the X-Y stage 15 and the electron beam 10 through the electrodes of the barrel 12 to expose a pattern on the wafer 20 according to pattern data supplied from a data storage 2B, making use of preset drawing parameters.

In the following paragraphs, field dividing and superimpose procedure of the hybrid technology according to the conventional system of FIG. 4 is described.

When biasing angle of the electron beam becomes larger than a limit, biasing distortion becomes not negligible degrading the drawing precision, in the electron beam exposure. Therefore, there is a limitation of the drawing area, which is called a field, where the electron beam can be shifted for pattern drawing within negligible biasing distortion. The size of the field is, generally, smaller than a desired chip size, and so, the electron beam exposure of a chip pattern is performed field by field, dividing the chip pattern into a plurality of fields each having a certain size.

As for the field dividing procedure, a method is disclosed in a Japanese patent application laid open as a Provisional Publication No. 219617/'91, wherein drawing data are divided into data of a plurality of sub fields, length of a side thereof being 1/N of a side of a maximum allowable field of the apparatus, N being a positive integer more than one. When high resolution is required, the electron beam exposure is performed each by each of the sub fields in the prior art, while it is performed on several sub fields not more than N×N sub fields, namely, the maximum allowable field, at once, where comparatively low resolution is allowed.

Another method is disclosed in a Japanese Patent Publication No. 15139/'96, wherein a small field size is applied for drawing a small pattern with sufficient preciseness and a large field size is applied for drawing a large pattern for maintaining throughput performance.

Now the superimpose procedure in the hybrid technology is described in connection with prior examples disclosed in Japanese patent applications laid open as Provisional Publications No. 186331/'82 and No. 057216/'87.

In the prior art of the Provisional Publication No. 186331/'82, reference marks for distortion measuring are provided on a reticle used for the optical exposure. By detecting the reference marks printed on a wafer, distortion amount of the printed pattern is measured by the electron beam exposure system, which is added to a positioning signal of the electron beam for superimposing fine patterns. Thus, a hybrid exposure is performed in this prior art.

In the prior art of the Provisional Publication No. 057216/'87, a compensation signal is prepared from distortion values beforehand measured of the optical exposure system according to kind of the pattern to be superimposed, that is, according to difference between a reticle pattern and a mask pattern.

However, in the hybrid technology wherein new patterns are superimposed by the electron beam exposure on a first pattern already printed by the optical exposure, the biasing distortion, previously mentioned, of the electron beam is derived in each field in addition to the optical distortion of the first pattern which is spread over its chip size. Furthermore, amount and variation, or differential of the optical distortion depend on position of each field relative to the chip size. Therefore, when design rule dimension become ultra-fine, it becomes very difficult to superimpose the electron beam pattern on the first pattern printed by the optical exposure with sufficient preciseness and sufficient efficiency, according to the hybrid technology of the prior arts wherein the size of the sub field or the small field is predetermined uniformly, even when the optical distortion can be measured exactly.

SUMMARY OF THE INVENTION

Therefore, a primary object of the present invention is to provide a method of and an apparatus for electron beam exposure convenient to be applied to the hybrid exposure of a pattern with ultra-fine design rules, wherein positioning of the electron beam is compensated with necessary and sufficient precision.

In order to achieve the object, a method of electron beam exposure according to an embodiment of the invention for superimposing a second pattern on a first pattern printed on a material by optical exposure; comprises:

a primary field dividing step for dividing the second pattern into a plurality of fields, each of the plurality of fields having a size whereon an electron beam can be radiated with a biasing distortion within a fixed value;

a primary fitting step for performing a fitting process for each of the plurality of fields, in the fitting process, cubic compensation equations, which are to be applied for compensating the second pattern in a concerning field to fit for optical distortion derived by the optical exposure of the first pattern in the concerning field, being adjusted by revising constant terms of the cubic compensation equations to minimize a maximum value of differences between the optical distortion and compensation values given by the cubic compensation equations at sampling points of the optical distortion in the concerning field, and at fitting error, which indicates maximum relative difference in the concerning field between the first pattern and the second pattern after compensated, being calculated;

a primary field dividing step for performing a field dividing process for each of the plurality of fields of which the fitting error is larger than a predetermined allowable range, in the field dividing process, a concerning field being divided into a pair of sub fields and the fitting process being performed for each of the sub fields; and a sub field dividing step for repeating the field dividing process for each of the sub fields, the fitting error of said each of the sub fields being larger than the predetermined allowable range and a size of said each of the sub fields being larger than a predetermine minimum size.

Therefore, most appropriate field dividing and compensation procedure can be performed according to optical distortion value distribution of the printed pattern, in the embodiment, enabling a hybrid exposure applicable to ultra-fine patterns with necessary precision as well as sufficient efficiency.

BRIEF DESCRIPTION OF THE DRAWINGS

The foregoing, further objects, features, and advantages of this invention will become apparent from a consideration of the following description, the appended claims, and the accompanying drawings wherein the same numerals indicate the same or the corresponding parts.

In the drawings.

DETAILED DESCRIPTION OF THE PREFERRED EMBODIMENTS

Now, embodiments of the present invention will be described in connection with the drawings.

Figure 1:
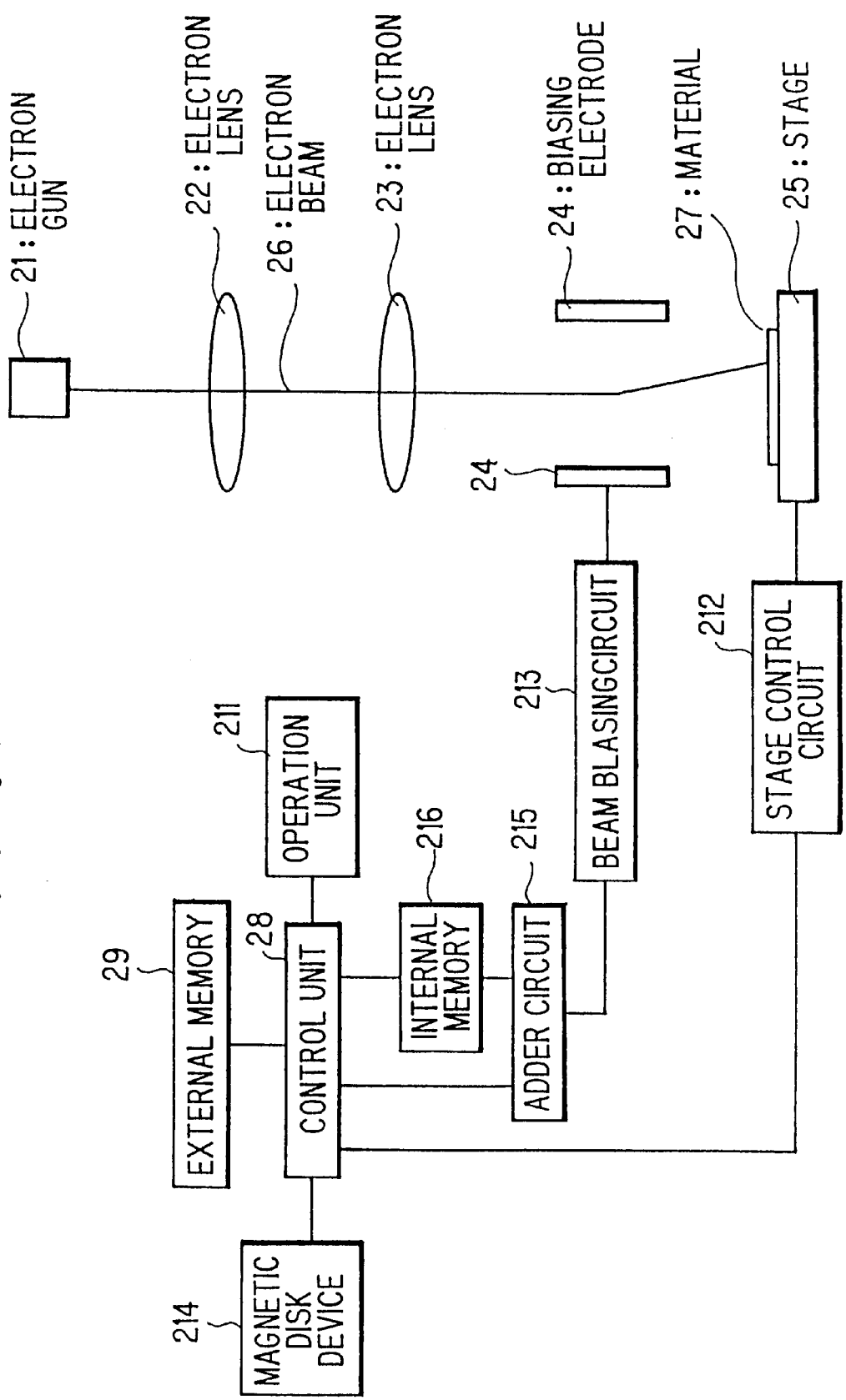
FIG. 1 is a block diagram illustrating an apparatus for realizing a method of electron beam exposure according to an embodiment of the invention.

FIG. 1 is a block diagram illustrating an apparatus for realizing a method of electron beam exposure according to an embodiment of the invention.

Referring to FIG. 1, the apparatus comprises;

electron gun 21 for generating an electron beam 26, electron lenses 22 and 23 for converging the electron beam 26 on a spot of a material 27, a set of biasing electrodes 24 for positioning the radiation spot of the electron beam 26 on a surface of the material 27, a beam biasing circuit 213 for generating a biasing signal for controlling the set of biasing electrodes 24, a stage 25 on which the material 27 is mounted, a stage control circuit 212 for generating a stage control signal according to which the stage 25 is shifted, a magnetic disk device 214 where distortion values of an optical exposure system are registered, an external memory 29 for storing drawing pattern data, prepared with a CAD (Computer Aided Design) system, for example, an operation unit 211 taking charge of size calculation of each of fields into which the drawing pattern data are divided, referring to the distortion values, an internal memory 210 for storing information of each of the fields such as a size and compensation values, that is, the shifting distance, the rotation angle, or the magnification gain thereof, an adder circuit 215 for adding the compensation values stored in the internal memory 210 to values of the drawing pattern data to be supplied to the beam biasing circuit 213 for indicating the radiation spot of the electron beam 26, and a control unit 28 for controlling the external memory 29, the internal memory 210, the operation unit 211, the magnetic disk device 214, the stage control circuit 212, and the beam biasing circuit 213 through the adder circuit 215.

The control unit 28 and the operation unit 211 is implemented by a CPU of a computer.

Figure 2:
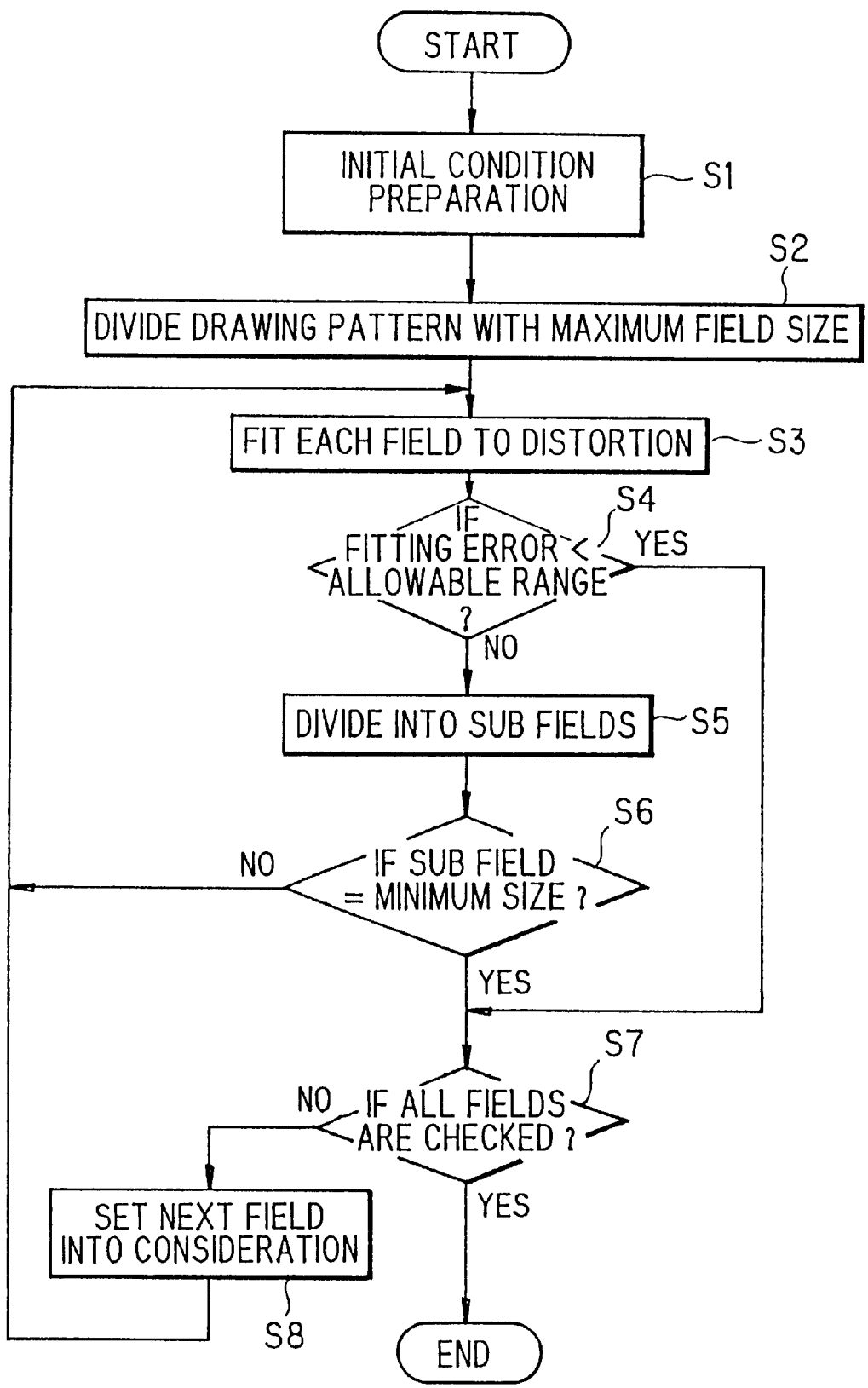
FIG. 2 is a flowchart illustrating a field dividing procedure of the embodiment of FIG. 1.
Figure 3:
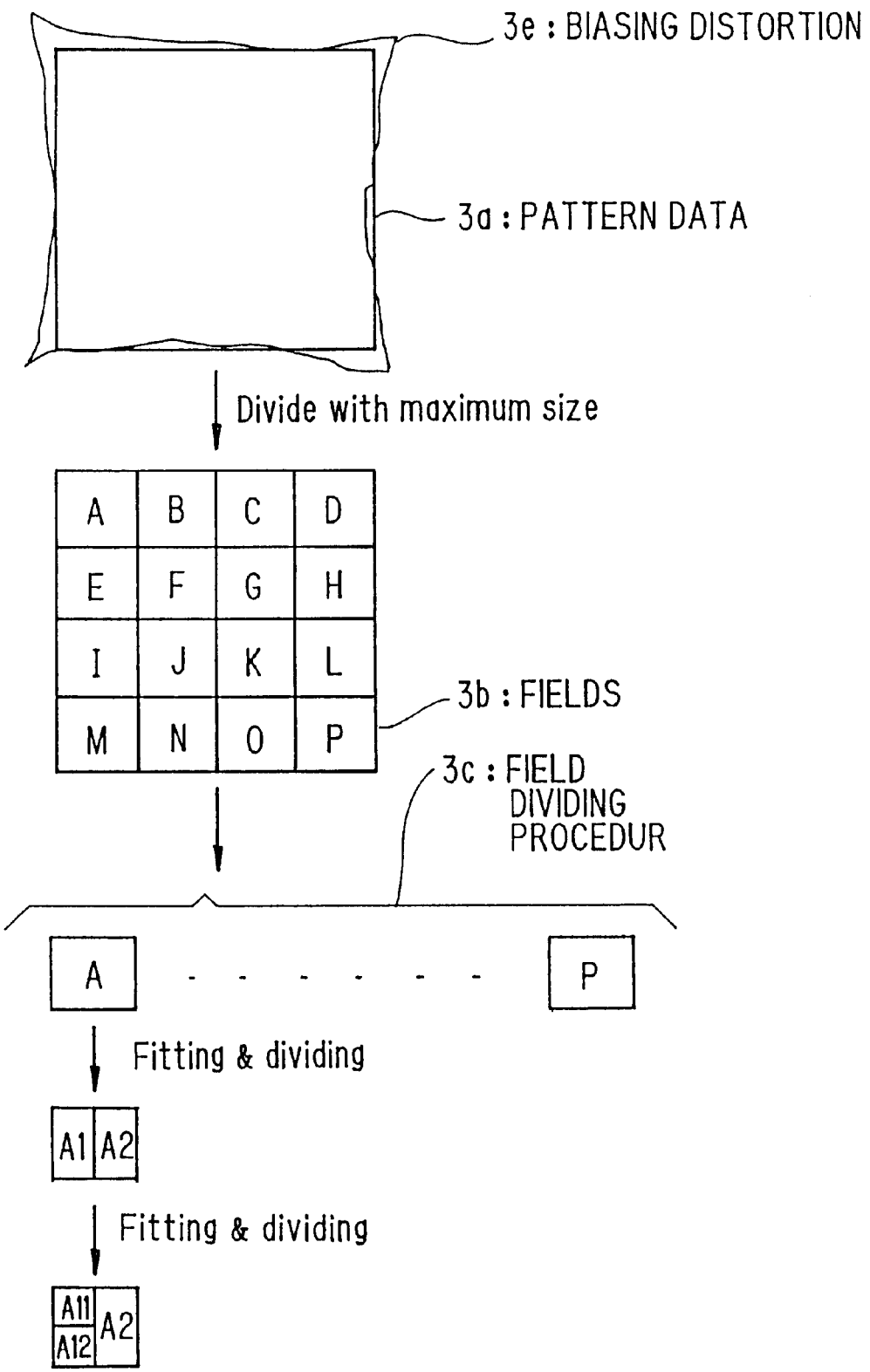
FIG. 3 is at schematic diagram illustrating the field dividing procedure of the embodiment of FIG. 1.
Figure 4:
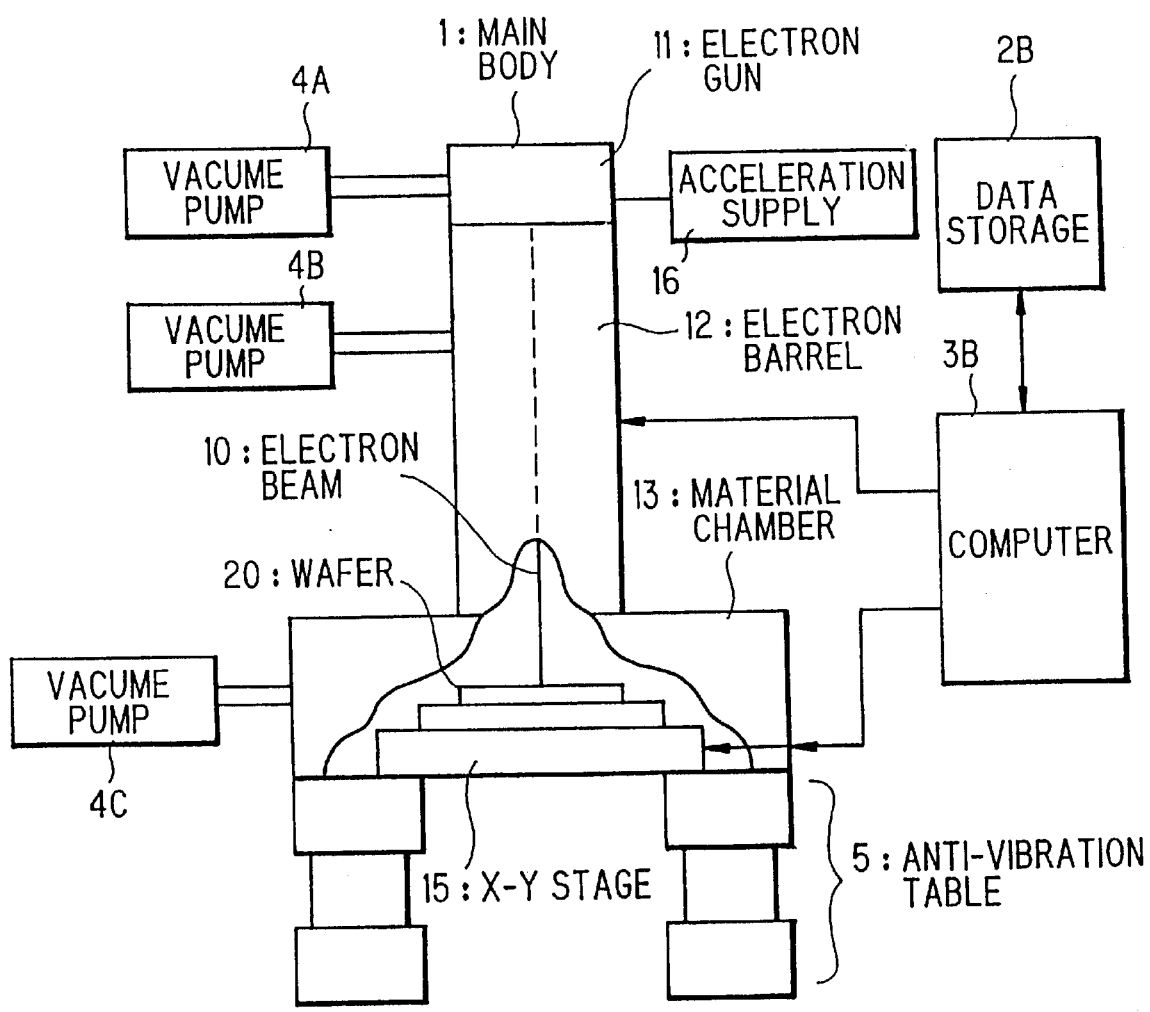
FIG. 4 is a schematic diagram illustrating configuration of a conventional example of the electron beam exposure system.

In the following paragraphs, a field dividing procedure of the embodiment is described in connection with a flowchart of FIG. 2 and a schematic diagram of FIG. 3 illustrating the field dividing procedure.

Referring to FIG. 2, at step S1, there are prepared initial conditions for the field dividing, including;

1) the distortion values of the optical exposure to be registered in the magnetic disk device 214,
2) a minimum size of fields into which a chip pattern is divided,
3) a fitting condition of a compensation equation, a cubic equation for example, to be applied for compensating the distortion values. In the embodiment, an allowable range of the distortion values left uncompensated (hereafter called the fitting error) after the fitting process according to the compensation equation is indicated as the fitting condition.

At step S2, the drawing pattern data of a pattern 3a of FIG. 3, for example, are divided into fields 3b, each A to P thereof having a maximum field size, and their information is stored in the internal memory 210. Here, the maximum field size is so determined that the biasing distortion 3e due to non-linear biasing of the electron beam 26 becomes negligibly small.

At step S3, information of each of the fields 3b is read out from the internal memory 210 and delivered to the operation unit 211 in order through the control unit 8. In the operation unit 211, the fitting process is performed for each of the fields 3b according to the delivered information referring to the distortion values measured and prepared in the magnetic disk device 214 making use of the compensation equation.

In the following paragraphs, an example of the above fitting process is described.

In the example, it is assumed that the compensation equation is represented by following equations (1) and (2), wherein constant terms $a_0$, $b_0$ gives shift values, first and second order terms giving gain values and rotation values, respectively.

$$X' = a_0 + a_1 X + a_2 Y + a_3 X^2 + a_4 Y^2 + a_5 X^3 + a_6 Y^3 \quad (1)$$

$$Y' = b_0 + b_1 X + b_2 Y + b_3 X^2 + b_4 Y^2 + b_5 X^3 + b_6 Y^3 \quad (2)$$

For the fitting process of a field A, for example, coordinates (X,Y) of each of sampling points included in the field A where the distortion values $\{X'_d, Y'_d\}$ are measured and registered in the magnetic disk device 214, are substituted in the equations (1) and (2). A square difference $(X'_d-X')^2 + (Y'_d-Y')^2$ is calculated for each of the sampling points. Then, a fitting point giving the maximum square difference among the sampling points in the field A is detected and the constant coefficients $a_0$ and $b_0$ is so revised that the square difference at the fitting point becomes zero. After revising the constant coefficients, coordinates (X,Y) of the other sampling points are substituted in the equations (1) and (2), and a maximum value of relative X-Y differences $|X'_d-X'|/X'_d$ and $|Y'_d-Y'|/Y'_d$ of the other sampling points is output as the fitting error.

This is an example of the fitting process. However, there may be applied any other appropriate process, for fitting the fields to the distortion and obtaining the fitting error. For example, the compensating equation may be square equations, any dependent ensemble of coefficients of each of the equations (1) and (2) may be revised for the fitting, or the fitness may be evaluated by sum of the square differences.

Returning to FIG. 3, the obtained fitting error is compared to the fitting condition, namely, the allowable range of 5%, for example, designated at step S1. When the fitting error is within the allowable range, control goes to step 7 and the fitting process of a next field, a field B in the example, is performed, control returning to step S3 through step S8.

On the other hand, when the fitting error of concerning field is larger than the allowable range, the concerning field, field A, is divided into a pair of sub fields A1 and A2 at step S5 as illustrated in a field dividing procedure 3c of FIG. 3. Here, when the fitting error indicating the maximum difference is defined by $|X'_d-X'|/X'_d$, the field A is divided right and left, while it is divided up and down when the fitting error is given by $|Y'_d-Y'|/Y'_d$ in the example.

Then, at step S6, it is checked whether the size of the divided sub fields is or not the minimum size designated at step S1. When it is the case, the control goes to step S7 for the next field fitting. Otherwise, the fitting process is performed for each of the sub fields A1 and A2, the control returning to step S3. These processes are repeated until the pattern 3a is divided into fields each either having a fitting error within the allowable range or having the minimum size.

Thus, the most appropriate field dividing and compensation procedure can be performed according to optical distortion value distribution of the printed pattern, in the embodiment, enabling a hybrid exposure applicable to ultra-fine patterns with necessary precision as well as sufficient efficiency.

What is claimed is:

1. An apparatus for electron beam exposure for superimposing a second pattern on a first pattern printed on a material by optical exposure; said apparatus comprising:
a first memory for storing optical distortion derived bay the optical exposure of the first pattern;
a second memory for storing data of the second pattern;
an operation unit for
dividing the second pattern into a plurality of fields, each of said plurality of fields having a size whereon an electron beam can be radiated with a biasing distortion within a fixed value,
performing a fitting process for each of said plurality of fields, in said fitting process, a compensation equation, which is to be applied for compensating the second pattern in a concerning field to fit to said optical distortion in said concerning field referring to said first memory, being adjusted by revising some of coefficients of said compensation equation according to said optical distortion in said concerning field, and a fitting error, which indicates maximum relative difference between the first pattern and the second pattern after compensated, being calculated,
performing a field dividing process for each of said plurality of fields of which said fitting error is larger than a predetermined allowable range, in said field dividing process, a concerning field being divided into a pair of sub fields and said fitting process being performed for each of said sub fields, and
repeating said field dividing process for each of said sub fields, said fitting error of said each of said sub fields being larger than said predetermined allowable range and a size of said each of said sub fields being larger than a predetermine minimum size;
a third memory for storing values supplied from said operation unit of said some of coefficients after revised for each of the plurality of fields which is not divided into said sub fields and said sub fields after repetition of said field dividing process;
a control unit for reading out said data of the second pattern stored in said second memory and calculating compensation values of said data according to said compensation equation referring to said values stored in said third memory for each of the plurality of fields which is not divided into said sub fields and said sub fields after repetition of said field dividing process;
an adder circuit for adding said compensation values to said data read out by said control unit; and
a beam biasing circuit for biasing said electron beam according to output of said adder circuit.

* * * * *

UNITED STATES PATENT AND TRADEMARK OFFICE
CERTIFICATE OF CORRECTION

PATENT NO. : 5,949,079
DATED : September 7, 1999
INVENTOR(S) : Naka Onoda

It is certified that error appears in the above-identified patent and that said Letters Patent is hereby corrected as shown below:

Column 6, Line 5: "derived bay" should read --derived by--

Signed and Sealed this

Seventeenth Day of October, 2000

Attest:

Q. TODD DICKINSON

*Attesting Officer*      *Director of Patents and Trademarks*